(12) United States Patent
Chung et al.

(10) Patent No.: US 6,953,741 B2
(45) Date of Patent: Oct. 11, 2005

(54) METHODS OF FABRICATING CONTACTS FOR SEMICONDUCTOR DEVICES UTILIZING A PRE-FLOW PROCESS

(75) Inventors: Eun-ae Chung, Suwon (KR); Myoung-bum Lee, Seoul (KR); Beom-jun Jim, Seoul (KR)

(73) Assignee: Samsung Electronics Co., LTD, Kyungki-Do (KR)

( * ) Notice: Subject to any disclaimer, the term of this patent is extended or adjusted under 35 U.S.C. 154(b) by 70 days.

(21) Appl. No.: 10/634,168

(22) Filed: Aug. 5, 2003

(65) Prior Publication Data

US 2004/0121570 A1 Jun. 24, 2004

(30) Foreign Application Priority Data

Dec. 20, 2002 (KR) ................................ 10-2002-0081741

(51) Int. Cl.⁷ ............................................. H01L 21/04
(52) U.S. Cl. ...................... 438/510; 438/637; 438/618
(58) Field of Search ................................ 438/233, 514, 438/513, 672, 669, 637, 622, 618, 597, 586, 585, 301, 510

(56) References Cited

U.S. PATENT DOCUMENTS

| | | | | |
|---|---|---|---|---|
| 4,313,809 A | * | 2/1982 | Benyon et al. | 204/192.25 |
| 4,516,145 A | * | 5/1985 | Chang et al. | 257/369 |
| 4,780,748 A | * | 10/1988 | Cunningham et al. | 257/24 |
| 4,898,841 A | * | 2/1990 | Ho | 438/652 |
| 4,912,065 A | * | 3/1990 | Mizuno et al. | 438/301 |
| 5,183,781 A | * | 2/1993 | Nakano | 438/629 |
| 5,188,987 A | * | 2/1993 | Ogino | 438/675 |
| 5,310,711 A | * | 5/1994 | Drowley et al. | 438/565 |
| 5,429,989 A | * | 7/1995 | Fiordalice et al. | 438/648 |
| 5,534,460 A | | 7/1996 | Tseng et al. | |
| 5,554,565 A | | 9/1996 | Liaw et al. | |
| 5,753,555 A | * | 5/1998 | Hada | 438/300 |
| 5,880,013 A | * | 3/1999 | Yang et al. | 438/514 |
| 6,030,894 A | * | 2/2000 | Hada et al. | 438/675 |
| 6,074,925 A | * | 6/2000 | Aisou | 438/365 |
| 6,093,625 A | * | 7/2000 | Wagner et al. | 438/514 |
| 6,162,668 A | * | 12/2000 | Oda et al. | 438/197 |
| 6,274,889 B1 | * | 8/2001 | Ota et al. | 257/77 |
| 6,403,454 B1 | * | 6/2002 | Citrin et al. | 438/514 |
| 6,492,192 B1 | * | 12/2002 | O'Toole et al. | 438/57 |

(Continued)

FOREIGN PATENT DOCUMENTS

JP            1-202817         *  8/1989

OTHER PUBLICATIONS

KR 2004057600 A, Koo, JC, Jul. 2, 2004.*
Van Zant, Peter, Microchip Fabrication, 4th ed. McGraw–Hill, pp. 333, 340–1.*
Notice to Submit Response, Korean Application No. 10–2002–0081741, dated Aug. 30, 2004.

Primary Examiner—Olik Chaudhuri
Assistant Examiner—Michael K. Luhrs
(74) Attorney, Agent, or Firm—Myers Bigel Sibley & Sajovec

(57) ABSTRACT

Methods for fabricating a contact of a semiconductor device are provided by patterning an interlayer dielectric of the semiconductor device to form a contact hole that exposes a silicon-based region of a first impurity type. The exposed silicon-based region is doped with a gas containing an element of the first impurity type and a contact plug is formed in the contact hole. Contact structure for a semiconductor device are also provided that include an interlayer dielectric of the semiconductor device having a contact hole formed therein that exposes a silicon-based region of a first impurity type. A delta-doped region of the first impurity type is provided in the exposed silicon-based region. A contact plug is provided in the contact hole and on the delta-doped region.

14 Claims, 2 Drawing Sheets

U.S. PATENT DOCUMENTS

| | | | |
|---|---|---|---|
| 6,509,263 B1 * | 1/2003 | Park et al. | 438/672 |
| 6,521,508 B1 * | 2/2003 | Cheong et al. | 438/416 |
| 6,627,473 B1 * | 9/2003 | Oikawa et al. | 438/46 |
| 6,642,620 B1 * | 11/2003 | Sharan et al. | 257/754 |
| 6,667,220 B2 * | 12/2003 | Jeon et al. | 438/400 |
| 6,674,131 B2 * | 1/2004 | Yokogawa et al. | 257/379 |
| 6,716,727 B2 * | 4/2004 | Walther | 438/514 |
| 6,767,834 B2 * | 7/2004 | Chung et al. | 438/709 |
| 6,797,559 B2 * | 9/2004 | Lee et al. | 438/239 |
| 6,818,537 B2 * | 11/2004 | Cheong | 438/586 |
| 6,844,259 B2 * | 1/2005 | Cheong | 438/657 |
| 6,849,555 B2 * | 2/2005 | Lee et al. | 438/715 |
| 6,858,529 B2 * | 2/2005 | Jin et al. | 438/629 |
| 2003/0015496 A1 | 1/2003 | Sharan et al. | |

* cited by examiner

METHODS OF FABRICATING CONTACTS FOR SEMICONDUCTOR DEVICES UTILIZING A PRE-FLOW PROCESS

RELATED APPLICATIONS

This application claims priority from Korean Patent Application No. 2002-81741, filed on Dec. 20, 2002, in the Korean Intellectual Property Office, the disclosure of which is incorporated herein in its entirety by reference.

BACKGROUND OF THE INVENTION

The present invention relates to the fabrication of semiconductor devices, and more particularly, to the fabrication of contacts for a semiconductor device.

As the integration density of semiconductor devices has increased and the semiconductor devices have been changed into three-dimensional structures, the use of contact holes having high aspect ratios also has increased. However, when a contact hole having a high aspect ratio is filled with a conductive material, such as a doped polysilicon, contact resistance may increase over that of a lower aspect ratio contact hole. The increased contact resistance may cause power dissipation to increase which may impede high-speed operations.

Fabricating a semiconductor device with a contact hole filled with doped polysilicon may include forming a gate pattern on a p-type semiconductor substrate. Next, an n-type impurity region, which may be a source/drain region, is formed in the semiconductor substrate on both sides of the gate pattern. An interlayer dielectric (ILD) is then formed on the surface of the semiconductor substrate, and a contact hole is formed so as to expose a portion of the n-type impurity region. Afterwards, a contact plug is deposited using a doped polysilicon to fill the contact hole. Thus, the source/drain region, which may be an n-type impurity region formed in the semiconductor substrate, may be electrically connected to an upper layer formed on the contact plug.

A method of improving contact resistance by treating (e.g., cleaning) the surface of the source/drain region, so as to decrease a contact resistance between the source/drain region and the contact plug is disclosed in the U.S. Pat. No. 5,534,460 entitled "Optimized contact plug process," dated Jul. 9, 1996. In this method, a native oxide layer is removed from the inside of a contact hole, and then the contact hole is filled with a doped polysilicon as a contact plug.

SUMMARY OF THE INVENTION

Embodiments of the present invention provide for fabricating a contact of a semiconductor device by patterning an interlayer dielectric of the semiconductor device to form a contact hole that exposes a silicon-based region of a first impurity type. The exposed silicon-based region is doped with a gas containing an element of the first impurity type and a contact plug is formed in the contact hole.

In particular embodiments of the present invention, the first impurity type is an n-type. Furthermore, the gas containing an element of the first impurity type may be $AsH_3$ and/or $PH_3$. Also, the contact plug may be doped polysilicon. The doped polysilicon may be doped with an element of the first impurity type. The element of the first impurity type may be phosphorus and/or arsenic.

In further embodiments of the present invention, doping the exposed silicon-based region with a gas containing an element of the first impurity type and forming a contact plug in the contact hole are performed in a chamber of the same manufacturing apparatus in-situ.

In still other embodiments of the present invention, the exposed silicon-based region is doped with a gas containing an element of the first impurity type at a temperature of from about 400 to about 800° C. Furthermore, doping the exposed silicon-based region may be performed under a chamber pressure of from about $6 \times 10^{-2}$ to about $6 \times 10^{-4}$ Torr for a time of from about 30 to about 180 seconds.

In particular embodiments of the present invention, the silicon-based region is a region of a silicon substrate doped with the first impurity type. The silicon-based region could also be a contact plug. For example, the silicon-based region may be a polysilicon contact plug doped with the first impurity type.

In additional embodiments of the present invention, a diffusion layer of the first impurity type is formed in a semiconductor substrate of a second impurity type. An interlayer dielectric is formed on a surface of the semiconductor substrate where the diffusion layer of the first impurity type is formed. In such embodiments, patterning the interlayer dielectric of the semiconductor device to form a contact hole that exposes a silicon-based region of a first impurity type may be provided by patterning the interlayer dielectric to form a contact hole that exposes the diffusion layer of the first impurity type to provide the exposed silicon-based region.

In yet other embodiments of the present invention, a diffusion layer of the first impurity type is formed in a semiconductor substrate of a second impurity type. A first interlayer dielectric is formed on a surface of the semiconductor substrate where the diffusion layer of the first impurity type is formed. A first contact hole is formed in the first interlayer dielectric to expose the diffusion layer of the first impurity type and a first contact plug is formed in the first contact hole using a doped polysilicon. A second interlayer dielectric is formed on a surface of the semiconductor substrate where the first contact plug is formed. In such embodiments, patterning an interlayer dielectric of the semiconductor device to form a contact hole that exposes a silicon-based region of a first impurity type may be provided by patterning the second interlayer dielectric to form a second contact hole exposing the first contact plug as the exposed silicon-based region.

In additional embodiments of the present invention, a contact structure for a semiconductor device includes an interlayer dielectric of the semiconductor device having a contact hole formed therein that exposes a silicon-based region of a first impurity type. A delta-doped region of the first impurity type is provided in the exposed silicon-based region. A contact plug is provided in the contact hole and on the delta-doped region.

In further embodiments of the present invention, the silicon-based region is a diffusion region of the first impurity type in a substrate of a second impurity type. The diffusion region may be a single crystal silicon region and the contact plug may be doped polysilicon.

In other embodiments of the present invention, the contact structure also includes a first interlayer dielectric having a first contact plug therein. The interlayer dielectric of the semiconductor device having a contact plug formed therein provides a second interlayer dielectric. The contact plug in the contact hole and on the delta-doped region provides a second contact plug. The silicon-based region is provided by the first contact plug in the first interlayer dielectric. In particular embodiments, the first contact plug and the second contact plug are doped polysilicon.

BRIEF DESCRIPTION OF THE DRAWINGS

The above and other features and advantages of the present invention will become more apparent by describing in detail preferred embodiments thereof with reference to the attached drawings in which.

DETAILED DESCRIPTION OF THE INVENTION

Figure 1:
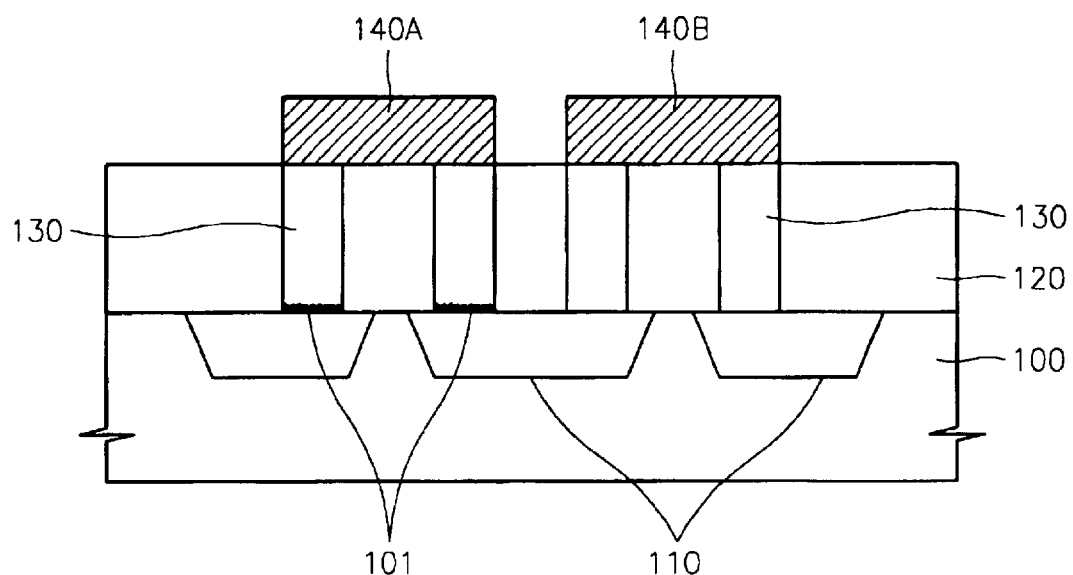
FIG. 1 is a cross-sectional view of a test element group (TEG) pattern region of a semiconductor device according to embodiments of the present invention.

The present invention will now be described more fully with reference to the accompanying drawings, in which preferred embodiments of the invention are shown. This invention may, however, be embodied in many different forms and should not be construed as being limited to the embodiments set forth herein. Rather, these embodiments are provided so that this disclosure is thorough and complete and fully conveys the concept of the invention to those skilled in the art. In the drawings, the shape and/or size of elements is exaggerated for clarity. Further, it will be understood that when a layer is referred to as being "on" another layer or substrate, it can be directly on the other layer or substrate, or intervening layers may also be present.

FIG. 1 is a cross-sectional view of a test element group (TEG) pattern region of a semiconductor device according to the present invention. Referring to FIG. 1, a diffusion layer 110 of a first impurity type (e.g., an n-type diffusion layer) is formed in the TEG region of a semiconductor substrate 100 of a second impurity type (e.g., a p-type semiconductor substrate). Next, an inter-layer dielectric (ILD) 120 is formed on the semiconductor substrate 100. The ILD 120 may, for example, be an oxide-based layer. The ILD 120 is patterned to form a contact hole, which exposes a portion of the diffusion layer 110 of the first impurity type. Contact plugs 130 are formed in the contact hole using a doped polysilicon. As illustrated in FIG. 1, one contact plug is formed according to embodiments of the present invention, while the other contact plug is formed according to a conventional method.

In accordance with particular embodiments of the present invention, a method of forming a first TEG pattern 140A connected to the contact plug 130 includes forming a pre-flow region 101 by doping the substrate 100 in the contact hole using a gas containing an element of a first impurity type, for example, $AsH_3$ or $PH_3$. The pre-flow region 101 may, in certain embodiments of the present invention, provide a delta doped region in the substrate 100. The pre-flow process is preferably carried out at a temperature of from about 400° C. to about 800° C. under a chamber pressure of about $6\times10^{-2}$ to about $6\times10^{-4}$ Torr for from about 30 to about 180 seconds. The contact plug 130 is the formed so as to fill the contact hole, for example, using polysilicon doped with an element of a first impurity type, such as phosphorus (P) or arsenic (As). In this case, the formation of the pre-flow region 101 and the formation of the contact plug 130 may be performed in a chamber of the same semiconductor apparatus, i.e., in-situ.

Thereafter, a titanium adhesive layer (not shown) and a titanium nitride barrier layer (not shown) may be formed on the contact plug 130. The first TEG pattern 140A is formed using tungsten on the contact plug 130 where the adhesive layer and the barrier layer are formed.

A second TEG pattern 140B connected to the contact plug 130 is formed according to conventional methods. In particular, a surface treatment, for example, a cleaning process, is applied to the diffusion layer 110 of the first impurity type, which is exposed by the contact hole. Then, the contact plug 130 is formed so as to fill the contact hole, for example, using polysilicon doped with an element of a first impurity type, such as P or As. After this, a titanium adhesive layer (not shown) and a nitride titanium barrier layer (not shown) are formed on the contact plug 130. The second TEG pattern 140B is formed using tungsten on the contact plug 130 where the adhesive layer and the barrier layer are formed.

Figure 2:
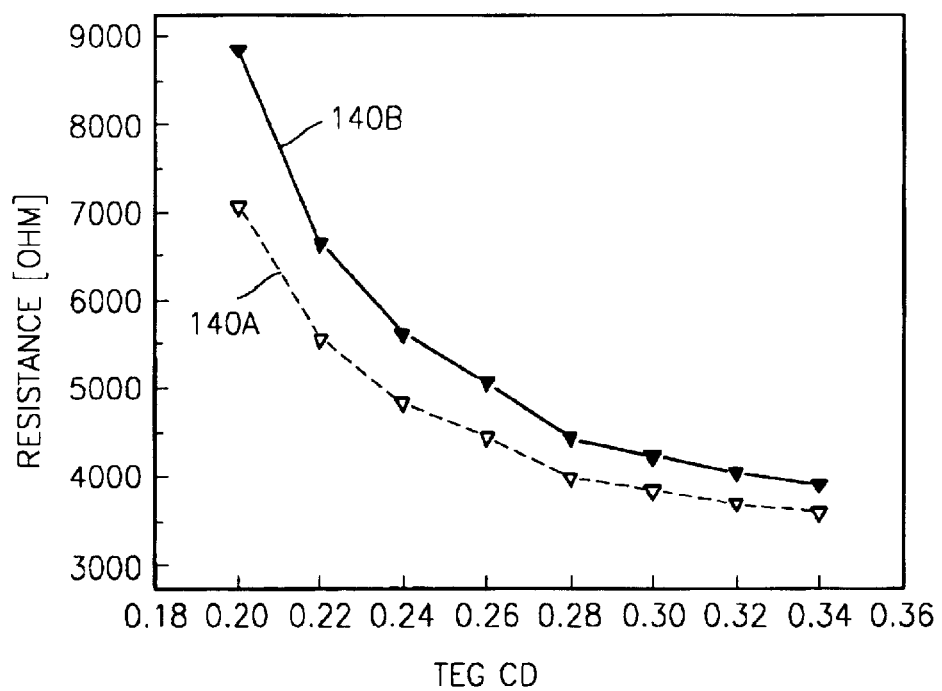
FIG. 2 is a graph showing effects of the present invention compared with those of the conventional method.

FIG. 2 is a graph showing contact resistances of contacts formed according to embodiments of the present invention, compared with contacts formed utilizing conventional methods. Referring to FIG. 2, the x-axis represents a critical dimension (CD) of each TEG pattern, and the y-axis represents contact resistance with respect to each critical dimension. In the graph, the -▼- line 140B represents contact resistance for a contact plug that is formed utilizing a conventional method, while the -▽- line 140A represents contact resistance for a contact plug where a pre-flow process is carried out according to embodiments of the present invention. Referring to the graph of FIG. 2, the TEG pattern 140A has a lower contact resistance than that of the TEG pattern 140B. For example, when the CD of the TEG pattern is 110 nm, contact resistance of the first TEG pattern 140A is improved by 20% over that of the second TEG pattern 140B.

In particular embodiments of the present invention, the pre-flow gas containing the element of the first impurity type is used to dope to a shallow depth into the surface of the diffusion layer of the first impurity type, thereby forming the pre-flow region 101. While not being bound by a particular theory of operation, it is believed that the pre-flow region 101 results in the improvement of the contact resistance. That is, the pre-flow region 101 may suppress the growth of a native oxide layer and expedite the epitaxial re-growth during subsequent thermal treatment, thus improving the contact resistance.

Figure 3:
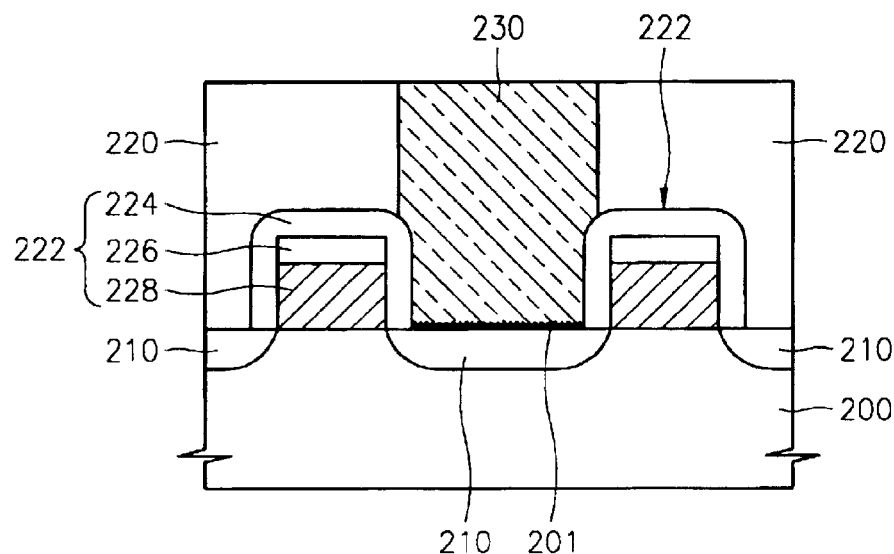
FIG. 3 is a cross-sectional view of a semiconductor device according to embodiments of the present invention.

FIG. 3 is a cross-sectional view of a semiconductor device illustrating particular embodiments of the present invention. Referring to FIG. 3, a trench isolation region (not shown) is defined in a semiconductor substrate 200 of a first impurity type, for example, a p-type semiconductor substrate, utilizing conventional techniques and a gate pattern is then formed. The gate pattern 222, which includes a gate electrode 228, a gate upper insulating layer 226, and a capping layer 224, can take various forms known to those of skill in the art. An ion implantation process uses the gate pattern as an ion implantation mask to provide a diffusion layer 210 of a first impurity type, for example, an n-type diffusion layer, in the surface of the semiconductor substrate 200 on both sides of the gate pattern 222. The diffusion layer 210 of the first impurity type corresponds to a source/drain region of an NMOS transistor.

Next, an ILD 220 is formed, for example, by deposition, on the semiconductor substrate 200 where the gate pattern 222 is formed, and is then planarized using, for example, an etchback process or a chemical mechanical polishing (CMP) process. Afterwards, a self-aligned patterning process is performed using the gate pattern so as to form a self-aligned contact hole, which exposes a portion of the diffusion layer 210 of the first impurity type. While formation of the contact hole is described with reference to a self-aligned process, the contact hole may be formed by methods known to those of skill in the art other than a self-aligned patterning process.

The semiconductor substrate 200 where the contact hole is formed is loaded in a chamber of a low-pressure chemical vapor deposition (LPCVD) apparatus. Then, a pre-flow process is carried out. Thus, a pre-flow region 201 may be provided in the substrate 200. The pre-flow region 201 may, in certain embodiments of the present invention, provide a delta doped region in the substrate 200, for example, in the diffusion layer 210. In particular embodiments of the present invention, a gas containing an element of a first impurity type, i.e., $AsH_3$, is used as the pre-flow gas, and the pre-flow process is conducted at the temperature of about 610° C. under the chamber pressure of about $6 \times 10^{-3}$ Torr for 60 seconds. After this process, a contact plug 230 is formed using polysilicon doped with As in the same chamber in-situ.

Table 1 shows a comparison of results of on-current of the NMOS transistor and contact resistance of the source/drain region between an NMOS transistor fabricated according to embodiments of the present invention and an NMOS transistor fabricated according to conventional methods.

TABLE 1

| Item | Present invention | Conventional method | Improvement ratio (%) |
| --- | --- | --- | --- |
| On-current | 8.44E6 [A] | 5.49E6 [A] | 54% |
| Resistance | 3600 [Ω] | 3980 [Ω] | 10% |

Referring to Table 1, the on-current of the NMOS transistor fabricated according to embodiments of the present invention is improved by about 54% over that of the conventional method, and the contact resistance of the source/drain region is improved by about 10% over that of the conventional method.

Figure 4:
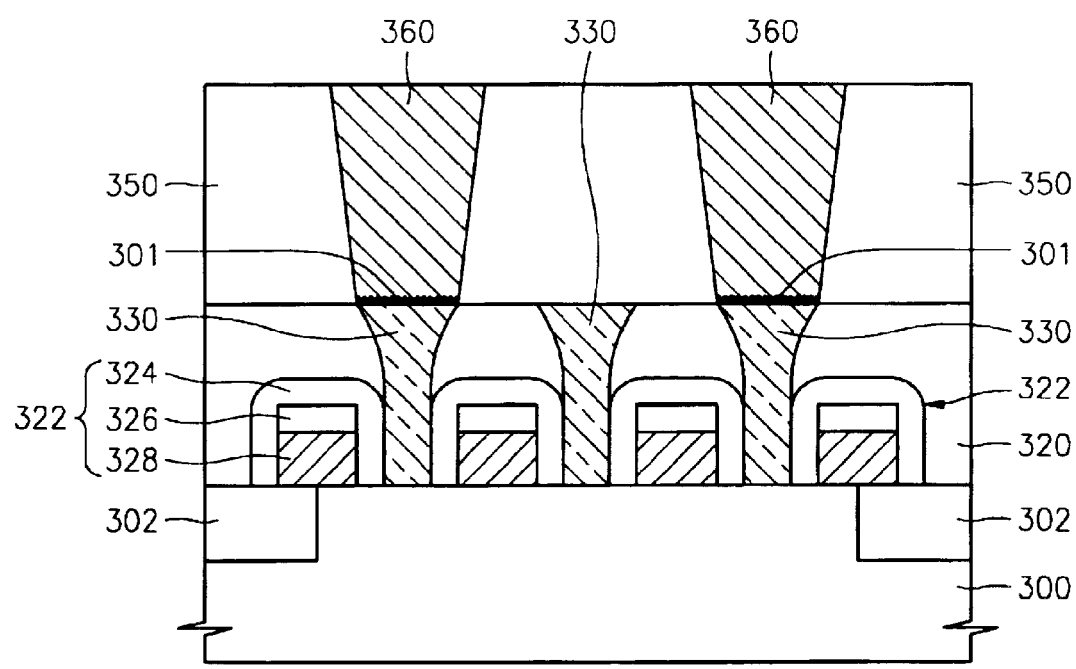
FIG. 4 is a cross-sectional view of a semiconductor device according to further embodiments of the present invention.

The embodiments of the present invention discussed above with reference to FIGS. 1 and 3 may provide for improved contact resistance between a semiconductor substrate formed of single crystalline silicon and a contact plug formed of silicon. However, as illustrated in FIG. 4 according to further embodiments of the present invention, contact resistance may also be improved between a first contact plug 330 formed of doped polysilicon and a second contact plug 360 formed of doped polysilicon. Thus, embodiments of the present invention may be utilized with exposed silicon-based regions so as to improve contact resistance to the silicon-based region. As used herein, the term "silicon-based" refers to single crystal silicon and/or polycrystalline silicon.

FIG. 4 is a cross-sectional view of a semiconductor device according to further embodiments of present invention. Referring to FIG. 4, a trench isolation layer 302 is defined in a semiconductor substrate 300 of a first impurity type. A plurality of gate patterns 322, each of which includes a gate electrode 328, a gate upper insulating layer 326, and a capping layer 324, are formed on the semiconductor substrate 300. As discussed above, different gate patterns may also be utilized. A diffusion layer (not shown) of a first impurity type, for example, a source/drain region, is also formed in the surface of the semiconductor substrate 300, for example, using the gate pattern 322 as an ion implantation mask.

A first ILD 320 is formed, for example, by deposition, to a thickness sufficient to cover the semiconductor substrate 300 and then planarized. A patterning process is applied to the first ILD 320 so as to form a first contact hole, which exposes the diffusion layer of the first impurity type. A first contact plug 330 is formed in the first contact hole. The first contact plug 330 is preferably formed of a polysilicon doped with an element of a first impurity type, e.g., As. A pre-flow process as described above may, optionally, be carried out prior to formation of the contact plug 330. If the semiconductor device is a memory device, a structure such as a bit line (not shown) is formed on the semiconductor substrate where the first contact plug 330 is formed.

Then, a second ILD 350 is formed, for example, by deposition, on the semiconductor substrate 300 where the first contact plug 330 is formed and then planarized. The second ILD 350 is patterned so as to form a second contact hole, which exposes the first contact plug 330. A pre-flow process is applied to the semiconductor substrate 300 where the second contact hole is formed as described above with reference to FIGS. 1 and 3. In particular embodiments of the present invention, the semiconductor substrate 300 where the second contact hole is formed may be loaded in a chamber of an LPCVD apparatus. In particular embodiments of the present invention, a gas containing an element of a first impurity type, e.g., $AsH_3$, is used as the pre-flow gas, and the pre-flow process is conducted at the temperature of about 610° C. under the chamber pressure of about $6 \times 10^{-3}$ Torr for about 60 seconds. Thus, a pre-flow region 301 is formed on the first contact plug 330. The pre-flow region 301 may, in certain embodiments of the present invention, provide a delta doped region in the first contact plug 330. After this process, a contact plug 360 is formed using polysilicon doped with As in the same chamber in-situ.

While the present invention has been particularly shown and described with reference to preferred embodiments thereof, it will be understood by those of ordinary skill in the art that various changes in form and details may be made therein without departing from the spirit and scope of the present invention as defined by the following claims.

What is claimed is:

1. A method of fabricating a contact of a semiconductor device, comprising:
    patterning an interlayer dielectric of the semiconductor device to form a contact hole that exposes a silicon-based region of a first impurity type;
    doping the exposed silicon-based region with a pre-flow gas containing an element of the first impurity type under a chamber pressure of from about $6 \times 10^{-2}$ to about $6 \times 10^{-4}$ Torr prior to forming a contact plug in the contact hole.

2. The method of claim 1, wherein the first impurity type is an n-type.

3. The method of claim 1, wherein said pre-flow gas containing an element of the first impurity type comprises $AsH_3$ and/or $PH_3$.

4. The method of claim 3, wherein doping the exposed silicon-based region with a pre-flow gas containing an element of the first impurity type is performed at a temperature of from about 400 to about 800° C.

5. The method of claim 3, wherein doping the exposed silicon-based region with a pre-flow gas containing an element of the first impurity type is performed for from about 30 to about 180 seconds.

6. The method of claim 1, wherein the contact plug comprises doped polysilicon.

7. The method of claim 6, wherein the doped polysilicon is doped with an element of the first impurity type.

8. The method of claim 7, wherein the element of the first impurity type comprises phosphorus and/or arsenic.

9. The method of claim 1, wherein doping the exposed silicon-based region with a pre-flow gas containing an element of the first impurity type and forming a contact plug in the contact hole are performed in a chamber of the same manufacturing apparatus in-situ.

10. The method of claim 1, wherein patterning an interlayer dielectric of the semiconductor device to form a contact hole that exposes a silicon-based region of a first impurity type comprises patterning an interlayer dielectric of the semiconductor device to form a contact hole that exposes a region of a silicon substrate doped with the first impurity type.

11. The method of claim 1, wherein patterning an interlayer dielectric of the semiconductor device to form a contact hole comprises patterning an interlayer dielectric of the semiconductor device to form a contact hole that exposes a first silicon-based contact plug of a first impurity type and wherein doping the exposed silicon-based region comprises doping the exposed silicon-based contact plug with a pre-flow a gas containing an element of the first impurity type under a chamber pressure of from about $6 \times 10^{-2}$ to about $6 \times 10^{-4}$ Torr.

12. The method of claim 11, wherein patterning an interlayer dielectric of the semiconductor device to form a contact hole that exposes a first silicon-based contact plug of a first impurity type comprises patterning an interlayer dielectric of the semiconductor device to form a contact hole that exposes a polysilicon contact plug doped with the first impurity type.

13. The method of claim 1, further comprising:

forming a diffusion layer of the first impurity type in a semiconductor substrate of a second impurity type;

depositing an interlayer dielectric on a surface of the semiconductor substrate where the diffusion layer of the first impurity type is formed; and wherein patterning an interlayer dielectric of the semiconductor device to form a contact hole that exposes a silicon-based region of a first impurity type comprises patterning the interlayer dielectric to form a contact hole that exposes the diffusion layer of the first impurity type as the exposed silicon-based region.

14. The method of claim 1, further comprising:

forming a diffusion layer of the first impurity type in a semiconductor substrate of a second impurity type;

depositing a first interlayer dielectric on a surface of the semiconductor substrate where the diffusion layer of the first impurity type is formed;

forming a first contact hole in the first interlayer dielectric to expose the diffusion layer of the first impurity type;

forming a first contact plug in the first contact hole using a doped polysilicon;

depositing a second interlayer dielectric on a surface of the semiconductor substrate where the first contact plug is formed;

wherein patterning an interlayer dielectric of the semiconductor device to form a contact hole that exposes a silicon-based region of a first impurity type comprises patterning the second interlayer dielectric to form a second contact hole that exposes the first contact plug as the exposed silicon-based region.

* * * * *

UNITED STATES PATENT AND TRADEMARK OFFICE
CERTIFICATE OF CORRECTION

PATENT NO. : 6,953,741 B2 Page 1 of 1
DATED : October 11, 2005
INVENTOR(S) : Chung et al.

It is certified that error appears in the above-identified patent and that said Letters Patent is hereby corrected as shown below:

Column 7,
Line 20, should read -- flow gas containing an element of the first impurity type --.

Signed and Sealed this

Eleventh Day of April, 2006

JON W. DUDAS
*Director of the United States Patent and Trademark Office*